United States Patent [19]

Lanz

[11] 4,128,805

[45] Dec. 5, 1978

[54] METHOD AND APPARATUS FOR LOCATING A FAULT ON A LINE

[75] Inventor: Otto Lanz, Niederrohrdorf, Switzerland

[73] Assignee: BBC Brown, Boveri & Company Limited, Baden, Switzerland

[21] Appl. No.: 777,527

[22] Filed: Mar. 14, 1977

[30] Foreign Application Priority Data

Mar. 25, 1976 [CH] Switzerland ................ 3717/76

[51] Int. Cl.² .......................................... G01R 31/08
[52] U.S. Cl. ........................................ 324/52; 361/80
[58] Field of Search ..................... 324/52; 361/79, 80

[56] References Cited

U.S. PATENT DOCUMENTS

| | | | |
|---|---|---|---|
| 3,931,502 | 1/1976 | Kohlas | 324/52 X |
| 3,983,377 | 9/1976 | Vitins | 324/52 X |

FOREIGN PATENT DOCUMENTS 871957  7/1961  United Kingdom ............ 361/80

*Primary Examiner*—Gerard R. Strecker
*Attorney, Agent, or Firm*—Werner W. Kleeman

[57] ABSTRACT

A method of, and apparatus for, locating a fault on a line, wherein current and voltage signals weighted relative to one another are formed from measurement signals corresponding to the line current and line voltage at a measurement location and after superimposing are used for a phase detection. At least one of the current signals or voltage signals is multiplied by a weighting factor at least approximately devoid of phase shift. From mutual relatively weighted current- and voltage signals there is determined the phase angle of a sinusoidal component of at least one auxiliary signal — corresponding to the sum or difference of a respective pair of mutually relatively weighted measurement currents and measurement voltages — in relation to a reference phase position which can be correlated to a reference location at the line.

42 Claims, 8 Drawing Figures

METHOD AND APPARATUS FOR LOCATING A FAULT ON A LINE

BACKGROUND OF THE INVENTION

The present invention relates to a new and improved method of detecting a fault location at an electrical conductor or line which entails forming mutually relatively weighted current- and voltage signals from measuring or measurement signals corresponding to line current and line voltage at a measuring or measurement location, and, after superimposing thereof, employing the same for phase detection. The invention is also concerned with apparatus for the performance of the aforesaid method.

A method of the previously mentioned type has become known to the art from the publication "Brown Boveri Mitteilungen", 1966, Volume 53, Nr. 11/12, pgs, 784–790, by virtue of the operation of the there illustrated electronic distance relay. This method is predicated upon the subtractive superimposing of a signal corresponding to the line voltage and one of the line currents (apart from a possible summation current component in the polyphase system). The current signal is multiplied by a predominantly inductive impedance which is designed as a line simulation, and thus weighted relative to the voltage signal in an appropriate (complex) relationship. Due to the dimensioning of the line simulation impedance there is fixed a trigger boundary. If the short-circuit location is considered to migrate beyond such trigger boundary then the phase angle between the superimposed signal formed of the weighted current signal and voltage signal, on the one hand, and the voltage signal, on the other hand, jumps between 0° and 180°, provided that the phase angle of the simulation impedance corresponds to that of the actual line impedance. On the other hand, the phase angle between the superimposed signal and voltage signal, during travel of the short-curcuit location past the trigger boundary, passes 90°. A detection of the phase angle and comparison with the boundary value 90° furnishes the direction of the fault location with respect to the trigger boundary.

A drawback of this prior art method resides in the fact that by virtue of the inductive weighting of the measurement current, corresponding to a differentiation as a function of time, the high-frequency components contained in the measurement current in addition to the sinusoidal components which should be evaluated, are relatively intensified. Thus, there is required an undesirably great use of filters and there exists impairment of the transient behavior of the filter from the standpoint of localizing the fault with as little delay as possible. Further, the use of variable inductances, especially infinitely variable inductances, and equally, the adjustment of inductances to predetermined fixed values, are associated with comparatively high costs and fabrication problems. The proper dimensioning and design of such inductances is crucial with the heretofore known techniques, because they deal with line simulation.

SUMMARY OF THE INVENTION

Therefore, with the foregoing in mind it is a primary object of the present invention to provide an improved method of, and apparatus for, locating a fault on a line which is not associated with the aforementioned drawbacks and limitations of the prior art proposals.

Another and more specific object of the present invention aims at locating a fault on a line with the use of a method and system which need not employ inductances for weighting the current- and voltage signals relative to one another.

Now in order to implement these and still further objects of the invention, which will become more readily apparent as the description proceeds, the method of the invention, generally contemplates forming mutually relatively weighted current- and voltage signals from measurement signals, which at a measurement or measuring location correspond to the line current and voltage current and after superimposing thereof using such weighted signals for a phase detection. At least one of the current signals or voltage signals is multiplied by a weighting factor at least approximately free of any phase shift i.e. without adding any phase shift. From mutually relatively weighted current- and voltage signals there is determined the phase angle of a sinusoidal component of at least one auxiliary signal relative to a reference phase position which is to be correlated to a reference location at the line. The auxiliary signal corresponds to the sum or difference of a respective pair of mutually relatively weighted measurement currents and measurement voltages.

As the current- and voltage signal for the determination of the auxiliary signal-phase angle there are employed the measurement currents and measurement voltages corresponding to the line current and line voltage, respectively, at the measurement location, and after weighting at least essentially free of phase shift, such are superimposed in pairs, additively or subtractively, into a respective auxiliary signal.

The method further contemplates forming two respective time integrals of at least one auxiliary signal, preferably multiplied by a respective time signal. The integration integral or the auxiliary signal or the time signal multiplied therewith is provided with a mutual time-shift within the integrand signals of the time integral. This time-shaft preferably corresponds to one-quarter period of the sinusoidal signal components to be evaluated, and the thus obtained time integrals logically coupled with one another by an evaluation function.

Apart from the aforementioned method aspects, and as already indicated above, the invention also concerns novel apparatus for the performance thereof which comprises, a measuring or measurement station having measuring devices for the line currents and line voltages prevailing at the measurement location as well as converters for converting these magnitudes into signals corresponding to the measurement current and the measurement voltage and comprising a multiplier- or divider circuit for weighting the current- and voltage signals relative to one another. There is also provided an evaluation circuit for the determination of the direction of the fault and the distance of the fault. The evaluation circuit comprises at least one phase detector. A multiplier- or divider circuit which is at least approximately free of any phase shift weights the current- and voltage signals respectively.

The phase angle of the auxiliary signal composed of the weighted current- and voltage signals in relation to a reference phase position or an evaluation function dependent upon such phase angle, especially the simple tangent function, or a composite evaluation function, or an evaluation function composed of tangent functions, under different permissible practical conditions, provides a clear measure of the distance of the fault location from a predetermined reference location at the line, namely the reference location which can be correlated to the reference phase position. In the case of a composite evaluation function this is valid under the assumption that there are present negligible line capacitances and insulation losses. Further, the (simply supplied) line corresponds to an equivalent-series current circuit possessing an inductive reactance ($X_L = \cap x \cdot L'$ wherein $X =$ line length and $L' =$ inductance per unit length) proportional to the line length and equally such a line resistance ($R_L = x \cdot R'$ wherein $R' =$ longitudinal resistance per unit length) as well as a short-circuit resistance (arc resistance) $R_L$. If the longitudinal resistance is neglected, then there is obtained an evaluation function proportional to the tangent of the phase angle and to the sum or difference of a weighting resistance R and the short-circuit resistance RL, and therefore with appropriate large dimensioning of the former the latter can be neglected. Moreover, if desired, the sine function can be employed in lieu of the tangent function, yet it is generally easier to obtain the latter. For the important determination of the direction of the fault location, which usually is sufficient for fault localization, relative to the reference location, it is only necessary to determine the numerator of the evaluation function or its sign or null position, and there are formed for the tangent and sine coinciding numerator terms.

If, on the other hand, there should be taken into account the line capacitance, under the assumption that the line is free of losses, then this can be accomplished by using the real wave resistance or characteristic impedance of the line as the weighting factor, and the fault distance from the reference location itself becomes proportional to the aforementioned phase angle. The therewith required formation of the arc tangent function or arc sine function can be omitted, however, in consideration of the practically always low angle values in favor of the use of the tangent or sine as the distance-proportional evaluation function. This holds true in fact for the determination of the direction of the fault location merely due to the significance of the sign. When assuming a loss-free line the evaluation functions of the direction of the fault location therefore coincide independent of the line capacitance in consideration of the trigonometric function, so that it is unnecessary to maintain the characteristic impedance as the weighting factor. This affords not only the previously mentioned possibility of dimensioning the short-circuit resistance to be negligible, but also there is possible adjustment or change of the reference location at the line which is to be correlated to the reference phase angle. Hence, there can be used the same reference phase angle for random reference location-adjustments. Oftentimes this is advantageous from the standpoint of the measurement procedures and circuit design.

In order to determine the phase angle or its tangent, especially for the null position- and sign determination of such magnitudes, two techniques are basically available: firstly, there can be actually formed an auxiliary signal corresponding to the relationship $R \cdot i_m \pm u_m$, wherein the symbol R is the weighting factor, $i_m$ the measurement current and $u_m$ the measurement voltage, or there can be formed a number of such auxiliary signals, followed by phase detection. The other technique is to form at least two respective time integrals for the measurement current and the measurement voltage followed by weighting and linking of these integrals by an evaluation function, which at least approximately corresponds to the numerator of a trigonometric function, preferably the tangent or sine, of a phase angle of an auxiliary signal of the type $R \cdot i_m \pm u_m$, wherein the latter however need not itself be formed. In both instances, current- and voltage signals, correlated to the measurement currents and measurement voltages, are weighted and superimposed as well as evaluated for the determination of an auxiliary signal-phase angle, and such current- and voltage signals either can be the measurement current and measurement voltages themselves or time integrals of the latter.

With algorithmic signal processing the reference phase position generally is represented by a sinusoidal reference signal, preferably by one of two auxiliary signals ($R \cdot i_m + u_m$ in relation to $R \cdot i_m - u_m$), or by simply the measurement voltage or the measurement current, advantageously, for instance, by the measurement current. When employing the first aforementioned solution the reference signal is then generally explicitly formed, whereas with the second solution a reference signal is not formed or only in the form of time integrals. Moreover, the reference phase position can be additionally changed in a defined manner with the aid of control- or circuit parameters and there is thereby altered the reference location. Both solutions are predicated upon the evaluation of sinusoidal signals or signal components and therefore require filtering of the measuring signals containing disturbance signals, especially markedly, transient components of other frequencies which particularly arise in the case of a short-circuit. Basically, this requirement can be satisfied by resorting to standard input filtering. On the other hand, the formation of time integrals affords the simple use of conventional correlation filtering by multiplication of the measurement current and measurement voltage within the integrand signals by time functions of suitable spectral composition (see, "IEEE Transactions on Power Applications and Systems", Vol.PAS-93, No. 5, pgs. 1522-34, Sept./Oct. 1974, the article of G. S. Hope, entitled "Sampling for Computer Protection of Transmission Lines"). There can be preferably used a time function or an appropriate signal possessing a frequency spectrum having at least a relative maxima in the range of the frequency of the sinusoidal signal components to be evaluated.

Furthermore, the evaluation can be also carried out by forming auxiliary signals of the type $R \cdot i_m \pm u_m$ instead of the otherwise subsequent phase detection, by forming at least two respective time integrals of the auxiliary signals with linking of the time integrals by means of an evaluation function which is dependent upon a phase angle. Also, in this case, there can be used correlation filtering.

Generally, it is further to be remarked that the weighting of the current-and voltage signals relative to one another can be accomplished in any form suitable for the nature of such signals and which renders possible superimposing of the weighted signals. If, for instance, there are used as the measurement currents and measurement voltages, signals in the form of a current or a voltage, respectively, as such are conventionally delivered by current- and voltage converters, then, weighting can be simply accomplished by introducing a resistor into the measurement current circuit which corresponds to the contemplated weighting factor and tapping-off the potential drop thereat as the weighted measurement current signal — which appears in the form of a voltage. The latter is then suitable directly for additive or subtractive superimposing upon the measurement voltage. In analogous but converse manner there can be obtained from the measurement voltage, by a series circuit containing a suitable resistor in a sufficiently low-ohmic connection current circuit, a signal in the form of a current, which, however, corresponds to the weighted measurement voltage and due to its dimensional form can be directly superimposed upon the measurement current — for instance at a suitable low-ohmic circuit element. Furthermore, it will be apparent from the foregoing that, signals corresponding to the measurement current and the measurement voltage can appear in a random form when using suitable measurement pick-ups, provided that such render possible a relative weighting and superimposing of both signals, and specifically, directly or after integration as a function of time and, if desired, additional linking or logical coupling.

BRIEF DESCRIPTION OF THE DRAWINGS

The invention will be better understood and objects other than those set forth above, will become apparent when consideration is given to the following detailed description thereof. Such description makes reference to the annexed drawings wherein.

DETAILED DESCRIPTION OF THE PREFERRED EMBODIMENTS

Figure 1:
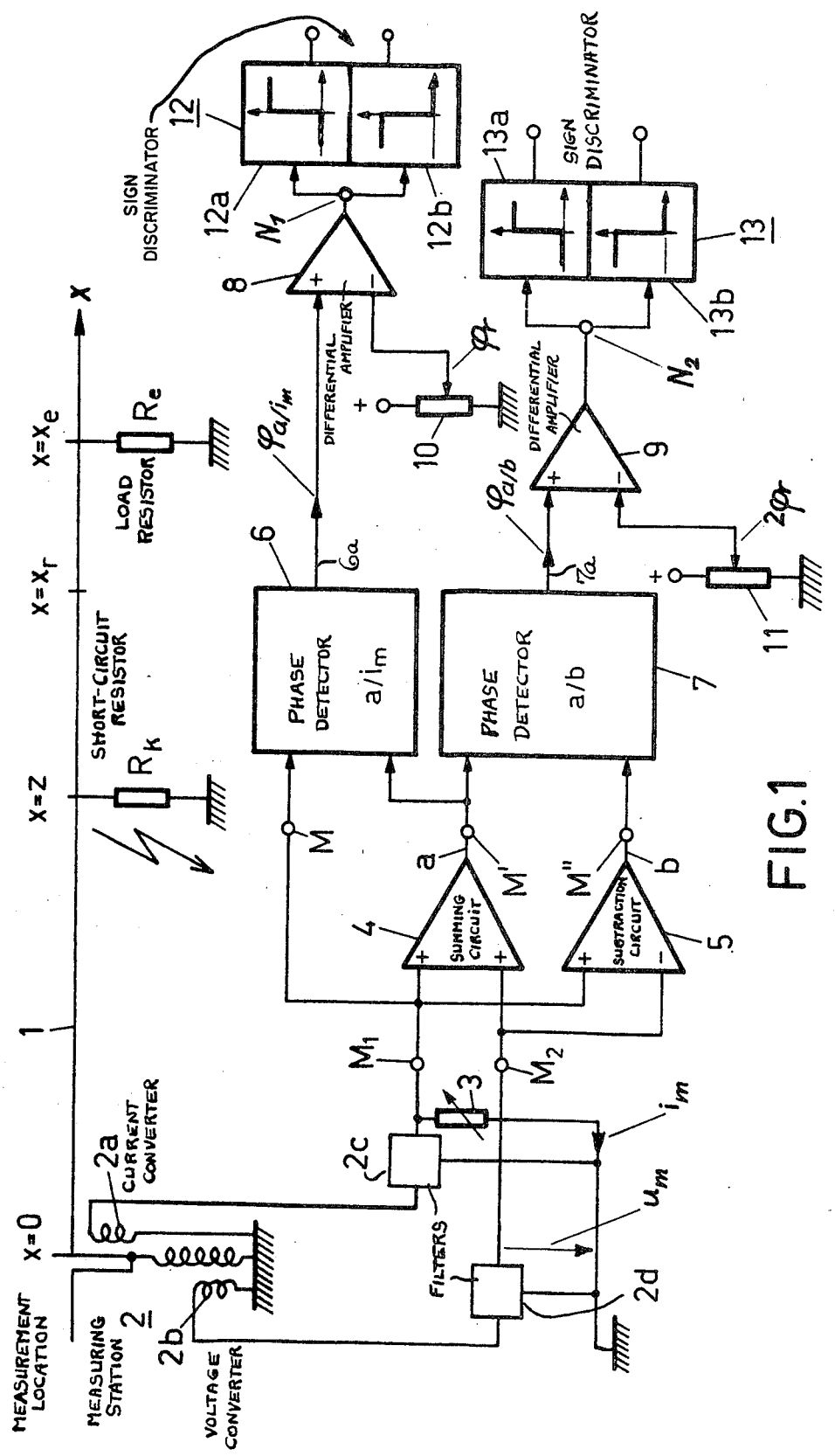
FIG. 1 illustrates a principle circuit diagram of a first embodiment of apparatus constructed according to the present invention for determining the location of a fault with measurement current and measurement voltage as the current- and voltage signals which are to be weighted.

Describing now the drawings, in FIG. 1 there is schematically illustrated a single-phase alternating-current line or conductor 1 containing a measuring or measurement station 2. The conductor or line length measured towards the right from the measurement or measuring location $x=0$ has been designated by reference character $x$. At the end of the line $x = x_e$ there is assumed to be present a load resistor $R_e$, at the fault location $x = z$ a short-circuit resistance $R_k$ which is negligibly smaller in contrast to the load resistor $R_e$. Furthermore, there is indicated a reference location at $x = x_r$.

The measuring or measurement station 2 comprises a current converter 2a and a voltage converter 2b. These converters produce measurement currents $i_m$ and measurement voltages $u_m$ corresponding to the line current and the line voltage, respectively, at the measurement location $x = 0$, which, especially after the occurrence of a fault possess a relatively large content of frequency components differing from the network frequency. With both converters 2a and 2b there are connected standard filters 2c and 2d which pass a predetermined frequency component, preferably the network frequency components, of the signals and generally dampen the remaining components. Furthermore, the signal processing can be carried out under the assumption that the measurement current $i_m$ is at the network frequency and the same assumption prevails for the measurement voltage $u_m$.

The measurement current $i_m$ flows through an adjustable resistor 3, which corresponds to a predetermined resistance-weighting factor R. At the circuit junctions or terminals $M_1$ and $M_2$ there thus appear the weighted measurement current $R \cdot i_m$ and measurement voltage $u_m$. Arranged in circuit thereafter are the summation and subtraction circuits 4 and 5, respectively, typically adding and subtraction amplifiers, where both of the aforementioned signals are additively and subtractively superimposed to form the respective first and second auxiliary signals $a = +u_m + R \cdot i_m$ and $b = -u_m + R \cdot i_m$. Both of the thus obtained auxiliary signals $a$, $b$ appear at the circuit points or junction M' and M'', whereas the weighted measurement current is separately delivered to the circuit junction or point M. Thereafter, there is connected in circuit two phase detectors 6 and 7, the inputs of which are formed by the circuit points M and M' and M' and M'', respectively, and the respective outputs 6a and 7a of which thus deliver an analog signal corresponding to the phase angle between the sinusoidal signals $a$ and $m_m$ and $a$ and $b$ respectively. As to these phase detectors 6 and 7 there can be used, in principle, conventional circuits, for instance as disclosed in the previously mentioned publication of "Brown Boveri Mitteilungen" (see the section "Phasenvergleich", pgs. 785, 786 and FIG. 3). Other possible detector circuits which can be advantageously employed for the practice of the invention will be considered more fully hereinafter.

At this point there will be explained the correlation of the fault distance with the determined phase angle, which fault distance is to be ascertained relative to a reference location and correlated according to magnitude and/or direction (sign):

Initially there is assumed, while neglecting the line capacitances and the insulation losses of the line, a simple equivalent current circuit in the form of a series circuit composed of the distance-proportional line inductance, the likewise distance-proportional line resistance and the short-circuit resistance (arc resistance). The relationships which are then valid will be explained while using the following symbols:

$\omega_o$ = angular frequency of the signal components to be evaluated $L'$ = characteristic inductance per unit length $x \cdot \omega_o L'$ = line inductance $R'$ = characteristic resistance per unit length $x \cdot R'$ = line resistance $R'/\omega_o L' = tg\phi_L$ = tangent of the line angle $R_k$ = short-circuit resistance $x$ = fault distance from measurement location $x_{a/b}$ = fault distance as a function of the phase angle of $a$ and $b$ respectively in relation to $i_m$ $x_{a/b}$ = fault distance as a function of the phase angle of $a$ relative to $b$ $a,b = R \cdot i_m \pm u_m$ = auxiliary signals $i_m$ = measurement current, $u_m$ = measurement voltage R = weighting factor (resistance)

$\phi a,b$ = phase angle of $a$ and $b$ respectively in relation to $i_m$ $\phi a/b$ = phase angle of $a$ in relation to $b$.

The short-circuit resistance can generally be assumed to be so small that the line section located behind the fault (viewed from the measurement location) can be considered to have negligible effect upon the conditions in front of the fault. This is also true for any possible current supply from the remote line end with the corresponding potential drop at the short-circuit resistance. Thus, there is assumed hereinafter that there is undertaken a simple power infeed at the observed line section from the side of the measuring or measurement location.

Now if by means of the phase detector 6 according to FIG. 1 the phase angle of the auxiliary signal $a$ or that of the auxiliary signal $b$ is determined with respect to the measurement current $i_m$, then such corresponds to a reference location coinciding with the measurement location i.e. a reference angle set to null. There is then valid for the fault distance — determined from $a/i_m$ and $b/i_m$ — the relationship:

$$x_{a,b} = \frac{R \pm R_k}{\omega_o L'} \cdot \frac{\pm tg\phi_{a,b}}{1 - tg\phi_L \cdot tg\phi_{a,b}} \qquad \text{Equation (1)}$$

In this equation the magnitudes $\phi$ and $x$ are correct as to sign and direction, respectively, in accordance with the lead or lag relative to the vector $i_m$ and must be inserted in accordance with a fault location-position forwardly or behind the measurement location.

The equation demonstrates the following:

1. The influence of $R_k$ upon the fault location-localization can be reduced by suitably dimensioning the magnitude R and, if necessary, can be completely neglected.

2. The tangent of the line angle and that of the auxiliary signal angle generally are near to one, their product even more so.

3. The auxiliary signal angle is generally so small that for good approximation the angle $\phi$ can be evaluated instead of the tangent for the determination of the distance magnitude. With respect to the null position there is present in any case coincidence.

There result the following generally sufficient equations:

$$x_{a,b} = \pm (R/\omega_o L') \cdot tg\phi_{a,b} \qquad \text{Equation (2)}$$

and $$x_{a,b} = \pm (R/\omega_o L') \cdot \phi_{a,b} \qquad \text{Equation (3)}$$

The output of the phase detector then delivers, in the form of an angle-proportional analog signal, the fault distance in terms of its magnitude and sign i.e. direction.

The influence of this short-circuit resistance upon the phase angle is opposite for both auxiliary signals $a$ and $b$. Therefore, if the fault distance from the measurement location is determined by means of the phase angle between the auxiliary signals $a$ and $b$, as such is accomplished by means of the phase detector 7 of FIG. 1, then there is a partial compensation of the errors caused by neglecting the short-circuit resistance. Neglecting the short-circuit resistance is in fact quite permissible in this case and there prevails the following relationship:

$$x_{a/b} = \frac{R}{\omega_o L'} \cdot \frac{1}{1 + tg^2\phi_L} \cdot \qquad \text{Equation (4)}$$

$$\left[ \frac{1}{tg\,\phi_{a/b}} \cdot \left( \sqrt{1 + tg^2\phi_{a/b} \cdot (1 + tg^2\phi_L)} - 1 \right) \right]$$

Furthermore, it will be apparent from the foregoing that the tangent of the line angle appears to the second power additively of the value 1, and therefore, can be also replaced by null with even less resultant error. The expression appearing in brackets in Equation (4) then reduces to the tangent of one-half of the phase angle between the auxiliary signals $a$ and $b$, resulting in the simpler equation:

$$x_{a/b} = (R/\omega_o L') \cdot tg\,(\phi_{a/b}/2) \qquad \text{Equation (5)}$$

and by evaluating the angle instead of the tangent results in:

$$x_{a/b} = (R/2\omega_o L') \cdot \phi_{a/b}, \qquad \text{Equation (6)}$$

which constitutes an advantageous simpler evaluation function associated with an extremely small amount of error.

As apparent from FIG. 1, it is now further possible to adjust a reference location $x_r$, which deviates from the measurement location, by merely subtractively superimposing an analog signal corresponding to $\phi_r$ and $2\phi_r$ respectively, at the output signal of the phase detector 6 and 7 respectively. For this purpose there are provided differential amplifiers 8 and 9 respectively, each having a respective potentiometer 10 and 11 and associated voltage source indicated by the symbol "+". At the circuit points or junctions $N_1$ and $N_2$, constituting the outputs of the aforementioned differential amplifiers 8 and 9 respectively, there appear the following signals which can be expressed by the relationships:

$$x_1 = x_{a,b} - x_r \qquad \text{Equation (7)}$$

and $$x_2 = x_{a/b} - x_r \qquad \text{Equation (8)}$$

Upon coincidence of the fault location and the set or adjusted reference location these signals are null and at fault location-positions to both sides of the reference location such signals have opposite signs, whereas the magnitude in each case corresponds to the fault distance from the reference location. Hence, the function of determining the fault location has been solved. In FIG. 1 there are also provided the sign discriminators 12 and 13, each having switches 12a, 12b and 13a, 13b associated with a respective one of both opposite signs and the associated outputs, each of which is correlated with a fault location-direction relative to the reference location.

Figure 2:
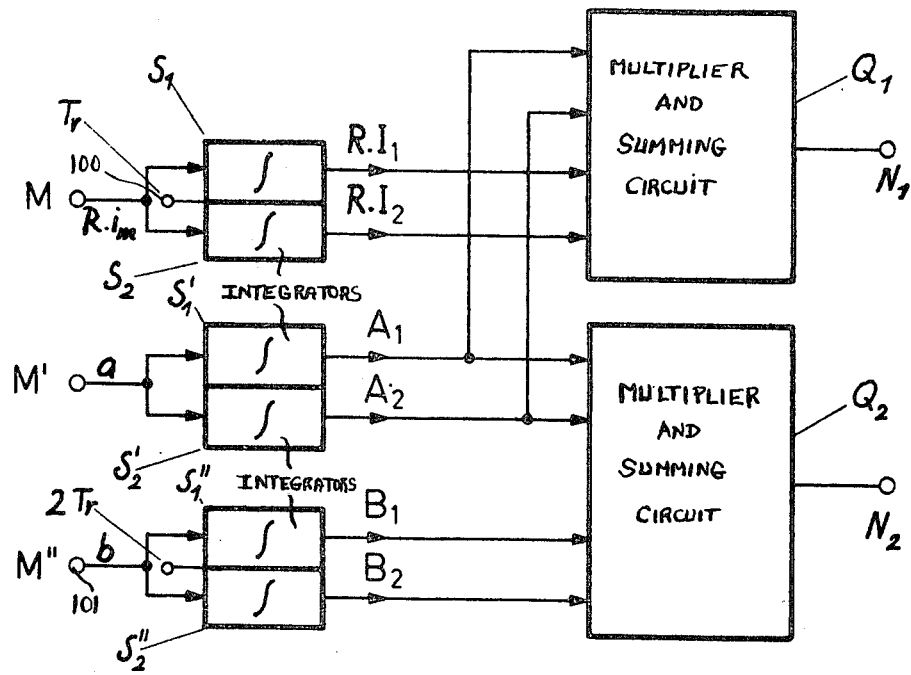
FIG. 2 illustrates an embodiment of phase detection of auxiliary signals with respect to one another and composed of superimposed weighted measurement currents and measurement voltages or with respect to the measurement current serving as the reference signal, by means of formed auxiliary signal-time integrals.

The circuitry of FIG. 2 essentially accomplishes the function of the phase detectors 6 and 7 of FIG. 1 and additionally can assume the function of the filters 2c and 2d thereof. With regard to FIG. 1 it is connected between the circuit points or junctions M, M', M" on the one hand as well as points $N_1$, $N_2$ on the other hand, and thus, replaces the circuit components arranged at these locations between such circuit points.

At each of the circuit points M, M', M" there is connected a respective pair of integrators $S_1$, $S_2$ and $S'_1$, $S'_2$ and $S''_1$, $S''_2$, connected in parallel at their input side, and possessing conventional integration interval-switching devices which thus have not here been further illustrated. The signals delivered to the aforementioned circuit points, i.e. $i_m$ and $a$ and $b$ respectively, thus form, either directly or following multiplication with a time signal, the integrand signals, and which time signal possesses properties which will still be considered hereinafter. Between the integrations carried out in each case in pairs in the integrators there is introduced a time-shift in a manner yet to be explained, and specifically, such that the obtained pairs of time integrals, namely $I_1$, $I_2$ and $A_1$, $A_2$ and $B_1$, $B_2$, respectively, approximately correspond to the amplitudes of two respective phase-shifted, preferably orthogonal components of the sinusoidal spectral components to be evaluated of the predetermined frequency $\phi_o$ within the relevant input signal ($i_m$ and $a$ and $b$ respectively). The amplitudes of these components — hereinafter assumed to be orthogonal — are thereafter combined, in a manner apparent from FIG. 2, into two respective pairs and delivered to a respective multiplier- and summing circuit $Q_1$ and $Q_2$, which with standard circuit components is able to form evaluation functions satisfying the following relationships:

$$A_1 I_2 - A_2 I_1 \qquad \text{Equation (9a)}$$

or $$B_1 I_2 - B_2 I_1 \qquad \text{Equation (9b)}$$

and $$A_1 B_1 - A_2 B_1 \qquad \text{Equation (10)}$$

In the embodiment of circuitry depicted in FIG. 2 there is delivered to the input of the integrators $S_1$ and $S_2$ via point M the weighted current signal $R \cdot i_m$, — although this is not absolutely necessary — and has the result that the factor R appears at the entire product polynomial of equation (9). In such case, this factor R does not have the effect of weighting the current- and voltage signals relative to one another, rather only acts as a scaling factor which is meaningless in any case for the determination of the fault location-direction. On the other hand, the relative current-voltage weighting is contained in the auxiliary signals $a$, $b$ and the corresponding time integrals.

The thus formed evaluation functions in each case constitute the numerator term of the tangent and sine of the phase angle between the signals $a$ and $i_m$ and $a$ and $b$ respectively. Thus, there is not only carried out the required filtering-out of a spectral component to be evaluated, but there is also obtained an evaluation function which, by means of its sign, indicates the fault location-direction relative to the measurement location.

For evaluation purposes there again can be employed the discriminators 12 and 13 of FIG. 1.

If the evaluation function also is to provide information as to the magnitude of the fault distance, then the circuits $Q_1$ and $Q_2$ are designed with conventional circuit elements for the formation of additional product polynomials and, in each case, for an additional quotient formation according to the following relationships:

$$tg\phi_a = \frac{R}{R} \cdot \frac{A_1 I_2 - A_2 I_1}{A_1 I_1 + A_2 I_2} \qquad \text{Equation (11)}$$

and $$tg\phi_{a/b} = \frac{A_1 B_2 - A_2 B_1}{A_1 B_1 + A_2 B_2} \qquad \text{Equation (12)}$$

and $$\sin\phi_a = \frac{R}{R^2} \cdot \frac{A_1 I_2 - A_2 I_1}{I_1^2 + I_2^2} \qquad \text{Equation (13)}$$

and $$\sin\phi_{a/b} = \frac{A_1 B_2 - A_2 B_1}{B_1^2 + B_2^2} \qquad \text{Equation (14)}$$

The here appearing factors R and $R^2$ respectively, are cancelled either in the indicated manner or only have attributable thereto the significance of scaling factors. Hence, for the distance determination there is available the complete tangent function and sine function, respectively, expressed in terms of orthogonal components.

The performance of the mathematical operations with analog or oftentimes digital circuit components is conventional and therefore needs no further illustration or discussion at this point.

Additionally, it should be understood that the measurement current $i_m$ as the reference signal in the phase detection of the auxiliary signal $a$ basically also can be replaced by other suitable reference signals, especially by those having a different phase shift in relation to $i_m$, so that there could be determined a reference location deviating from the measurement location. One such reference signal $p$ can be simply introduced in the arrangement of FIG. 2 instead of i $i_m$, and then delivers a pair of corresponding time integrals $P_1$, $P_2$, which are introduced into the evaluation function instead of $I_1$, $I_2$.

With the circuitry of FIG. 2 a reference location differing from the measurement location can be adjusted or set by means of an additional time-shift between the integration of both signals which are to be phase compared. This time-shift, the magnitude of which is correlated by the angular frequency to a corresponding phase angle, in the circuit of FIG. 2, in each instance conjointly concerns a pair of integrators. On the other hand, the already discussed time-shift for obtaining orthogonal components relates to an integrator of one such pair with regard to the other integrator of the same pair. In FIG. 2 there is shown the introduction of a reference location-time-shift $T_r$ and $2T_r$, respectively, with a respective common adjustment or setting input 100 and 101 for the integrator pair $S_1$, $S_2$ and $S''_1$, $S''_2$. The introduction and function of such time-shift likewise will be explained more fully hereinafter.

Furthermore, there can be accomplished a reference location displacement also with the circuitry of FIG. 2 in that, instead of or in addition to the introduction of a time-shift into the integrations there is carried out an additive or subtractive superimposing of an analog signal to the tangent- or sine evaluation functions or their numerators. For this purpose, the outputs of the multiplier- and summing circuits $Q_1$ and $Q_2$ are arranged at the inputs of the differential amplifiers 8 and 9, respectively, FIG. 1. The superimposed signal component then corresponds to the relevant trigonometric function i.e., its numerator, not however to a phase angle. This can be of advantage, since the fault distance, with negligible line capacitance, is directly a function of the tangent or sine, and in particular proportional to the tangent of the phase angle, and only when such is further negligible proportional to the phase angle itself.

Figure 3:
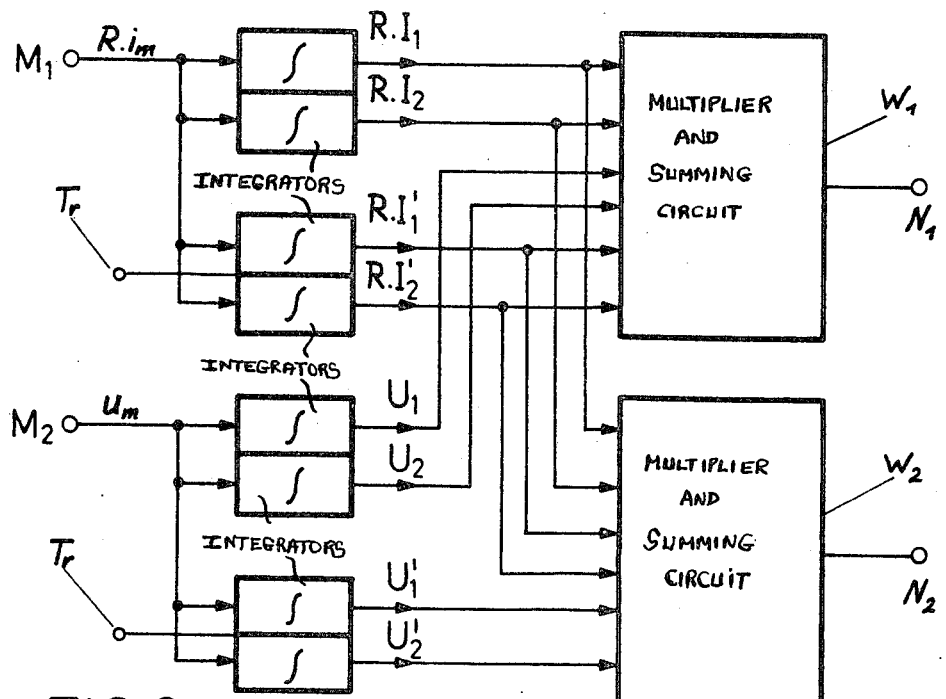
FIG. 3 illustrates an exemplary embodiment of indirect phase detection for auxiliary signals relevant to fault localization, but not themselves formed, with the aid of measurement current- and measurement voltage-time integrals serving as the current- and voltage signals which are to be weighted.

With the embodiment of FIG. 3 there appear as the current- and voltage signals which are to be weighted relative to one another the time integrals of the measurement current and the measurement voltage. The relative weighting appears, in the embodiment under discussion, in the form of the resistance factor R for the measurement current-time integrals $I_1$, $I_2$. This weighting factor is already introduced, again by way of example only when using the circuit of FIG. 1 without modification, at the input side by multiplication of the measurement current with the resistance factor R. However, in the input circuit there could be basically used another suitable signal converter for transforming the measurement current into an appropriate signal having voltage dimensions, and thereafter introducing the weighting factor R, preferably at the evaluation circuits, and especially at the multiplier- and summation circuits at the output of the integrators by the use of appropriate multipliers. Moreover, as already generally mentioned heretofore, the measurement current and measurement voltage of course could be processed in the form of signals of random dimension, so that also with a circuit arrangement according to FIG. 1, where at the input side their is accomplished relative weighting of the current- and voltage signals, the corresponding multiplication must be carried out differently than by tapping-off a potential drop across a resistor to which flows the measurement current. With the circuitry of FIG. 3, when using time integrals of the measurement current and the measurement voltage as the current- and voltage signals, what is decisive is only the resultant effect of the weighting factor in the evaluation functions formed from the time integrals.

According to FIG. 3 there is again performed in each case pairs of integrations with mutual time-shift for obtaining preferably orthogonal signal components. The integrators are clearly characterized for the time integrals by the symbols appearing at the output side, and therefore, to preserve clarity in illustration in FIG. 3 have not further been shown.

There are formed a total of two sets of orthogonal current- and voltage-time integration pairs, namely $R.I_1$, $R.I_2$ and $U_1$, $U_2$ as well as $R.I'_1$, $R.I'_2$ and $U'_1$, $U'_2$. Both of these time integral sets exhibit with respect to one another — analogous to what has been discussed already with respect to FIG. 2 — a reference location time-shift $T_2$ with corresponding, common input for the relevant integrator pairs. The thus obtained time integrals are combined in the manner shown in FIG. 3 into three respective pairs at the inputs of two multiplier- and summation circuits $W_1$, $W_2$, which can be used alternatively or also conjointly and carry out mathematical operations with standard analog or also digital circuit components according to the following evaluation functions (see also Equations (9a) and (9b)):

$$-(R^2(I'_1 \cdot I_2 - I_1 \cdot I_2) + U'_1 \cdot R \cdot I_2 - U'_2 \cdot R \cdot I) \text{ for } W_1 \quad \text{Equation (15)}$$

and $$R^2(I_1 \cdot I'_2 - I'_1 \cdot I_2) + U_1 \cdot R \cdot I'_2 - U_2 \cdot R \cdot I'_1) \text{ for } W_2 \quad \text{Equation (16)}$$

In these equations it should be apparent that the weighting factor R can be factored out once as irrelevant scaling factor for the sign determination. The remaining expressions again correspond to the numerator terms of the tangent or sine, and in this case specifically the phase angle between an auxiliary signal $a$ which itself has not been explicitly formed and the measurement current which is further phase-shifted according to $T_r$ and corresponding to a reference location which differs from the measurement location.

When using weighted measurement current- and measurement voltage-time integrals there also can be formed as evaluation function a trigonometric function of the phase angle between both auxiliary signals $a$ and $b$ and upon which is superimposed a reference angle ($\phi_r$ corresponding to $T_r$), and specifically, while utilizing both sets of measurement current- and measurement voltage-time integrals formed by means of an integrator circuit constructed in the manner of FIG. 3, and having a numerator of the following type:

$$R(I_1 \cdot I'_2 - I'_1 \cdot I_2) - (I_1 \cdot U'_2 + I'_1 \cdot U_2 - I'_2 \cdot U_1 - I_2 \cdot U'_1) + (1/R) \cdot (U'_1 \cdot U_2 - U_1 \cdot U'_2) \quad \text{Equation (17)}$$

As concerns this function, it is possible to oftentimes neglect the last term appearing between the parenthesis, which consists of subtractively coupled products of the measurement voltage-time integrals, because in the case of a short-circuit the measurement voltages become comparatively small, yet the measurement currents comparatively large. The numerator again can be analogously augmented, by quotient formation with a suitable denominator, into the complete trigonometric function for a distance-magnitude determination. Moreover, there can again be present a weighting function as a scaling factor for the magnitude value, not however for the distance determination.

What is still to be mentioned is the possibility of completely determining the magnitude and direction of the fault distance with respect to the measurement location while utilizing only a simple set of measurement current- and measurement voltage-time integrals $I_1$, $I_2$, $U_1$, $U_2$. The following evaluation function is valid in this respect:

$$\frac{U_1 \cdot I_2 - U_2 \cdot I_1}{R^2 \cdot I_1^2 - U_1^2 + R^2 \cdot I_2^2 - U_2^2} \quad \text{Equation (18)}$$

In order to obtain the previously mentioned evaluation functions there are available conventional multiplier- and summation circuits and quotient formers with an appropriate multiplicity of inputs associated with the different measurement current- and measurement voltage-time integrals. The time integrals basically always can be obtained by means of a complete or abbreviated multiple-integrator circuit according to FIG. 3. The grouping together and connection of the outputs of such integrators with the associated multiplier- and summation- or quotient circuits then directly results from the linking or logical coupling of the time integrals and from their weighting within the evaluation function.

Figure 4:
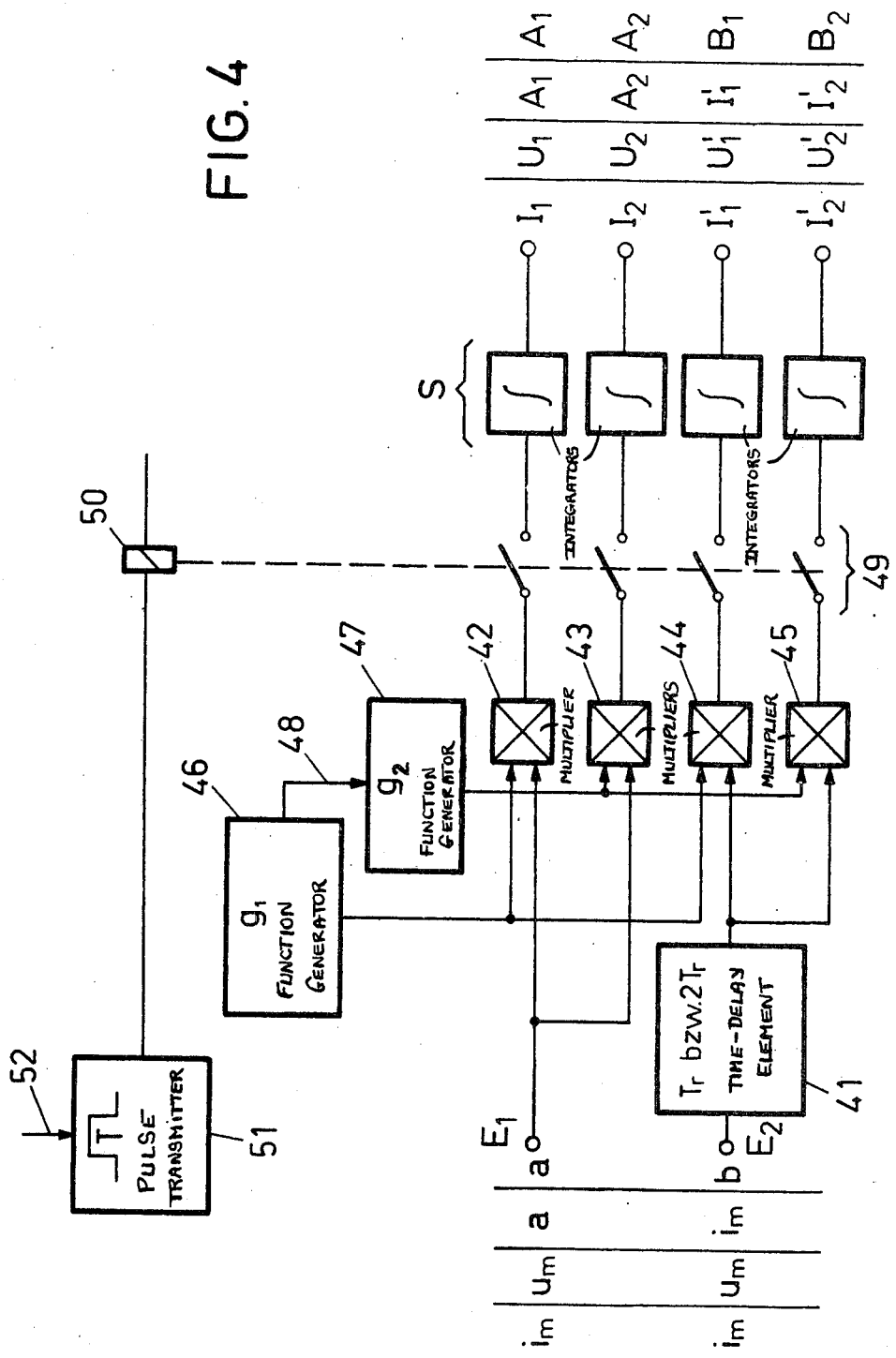
FIG. 4 is a block circuit diagram of an integration circuit employing correlation filtering for a phase detection according to FIG. 2 or FIG. 3.

In FIG. 4 there is illustrated in detail a multiple-integration circuit with integration interval-switching device for the approximate generation of the previously mentioned orthogonal components. The inputs $E_1$ and $E_2$ of this integration circuit have applied thereto, depending upon the nature of the different integral formations according to FIGS. 2 or 3, the signals which have been shown arranged in a column in FIG. 4 at the left side thereof adjacent the mentioned inputs. Hence, in corresponding manner there is formed at the outputs of the integrator set S in each case a column of time integrals indicated in FIG. 4 at the right side next to the integrator outputs. From these time integrals it will be apparent that there can be grouped together all of the combinations of time integrals indicated in FIGS. 2 and 3 for the subsequent evaluation. For the embodiment of FIG. 3, wherein there is required in each instance a set of current- and voltage-time integrals, the integration circuit of FIG. 4 must be correspondingly doubled, which will be readily understood and thus requires no further discussion here. Moreover, the inputs $E_1$ and $E_2$ of course must be conceived as connected together, if they are supplied with the same signals. This has been indicated in simplified manner in FIG. 4 by the double indication of $i_m$ and $u_m$ in both of the first input columns.

The reference location-time-shift $T_r$ or $2T_r$, already heretofore considered with respect to its effect, is supplied to the input $E_2$ of a time-delay element 41. The non-delayed signal from the input $E_1$ and the time-delayed signal from the input $E_2$ are delivered, in the illustrated manner, in parallel to two respective multipliers 42 and 43 and 44 and 45, and specifically in each case together with a time signal $g_1$ and $g_2$, respectively, serving as the multiplier term. Each of these two time signals $g_1$ and $g_2$ is multiplied, with the aid of the illustrated line branches, in one of the multipliers 42-45 with each of the signals delivered from the inputs $E_1$ and $E_2$. Both of the time or timing signals $g_1$ and $g_2$ possess a time-shift relative to one another of preferably one-quarter of the period of the frequency to be evaluated. Moreover, they possess a spectral composition or spectrum which is suitable for the approximative orthogonal component formation and filtering. They are produced by suitable function generators 46 and 47 of conventional design having a construction corresponding to the desired time course and mutually synchronized by means of a control connection 48. The mutual time-shift can be realized by the use of equally conventional timing elements in a manner which will be readily apparent to those skilled in the art. Reference character $g_1$ for instance can represent a portion of a sine function dependent upon time, and reference character $g_2$ then can correspond to the time-shift through one-quarter period of a portion of a cosine function. However, there also can come under consideration other time functions of dome- or bell-shaped configuration up to rectangular-shaped time functions or appropriate function portions or sections.

Between the outputs of the multipliers 42-45 and the integrator set S there is arranged a contact set 49 of a relay 50, the latter of which is energized by a square-wave-pulse transmitter 51, after excitation by means of a control input 52, for a time interval T of predetermined duration. This time interval T thus constitutes the effective integration interval which possesses the same time position and duration for all integrators. For the exact formation of orthogonal components by means of time integration there is needed, as is known, integration intervals of infinite duration. However, practical experimentations have shown that it is possible to work with sufficient approximation with integration intervals down to one-half and even one-quarter of a period of the evaluation function.

Figure 5:
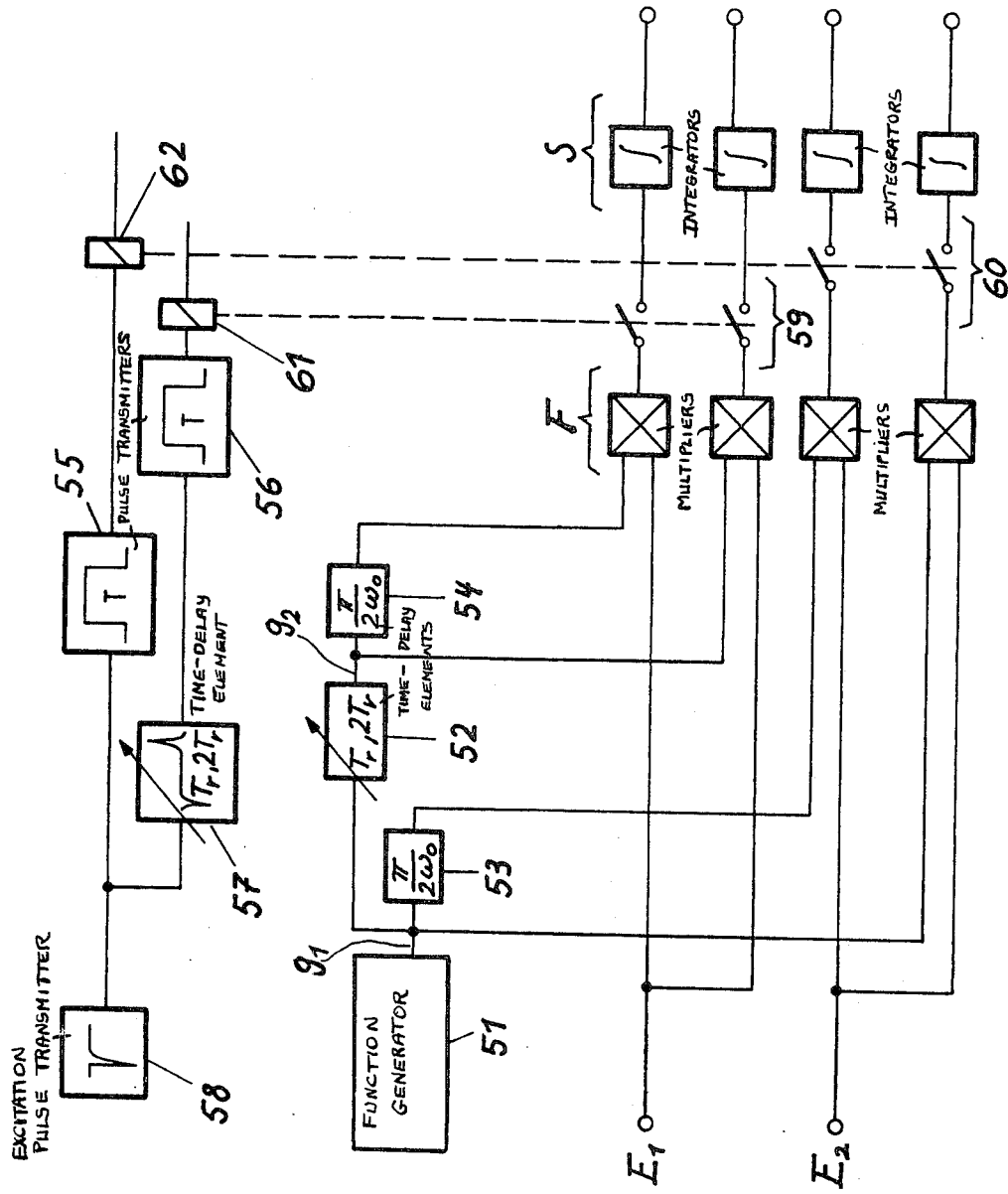
FIG. 5 is a block circuit diagram of another embodiment of integration circuit with which there is connected an evaluation circuit.

The inputs $E_1$ and $E_2$, as well as the outputs which have here not been further designated, of the integration circuit according to FIG. 5, can be connected in the same circuit configuration as explained with respect with respect to FIG. 4. From the time integrals which are to be formed in toto by each of these circuit variants there can be especially also derived evaluation functions having a numerator term of the type according to Equation (17), and by eliminating the time-shifted integral also those for an evaluation function of the type according to Equation (18).

The circuitry of FIG. 5 differs from that of FIG. 4 by the elimination of the time-delay in an input channel. Instead, there is present a time-shift $T_r$ and $2T_r$, respectively, at two other locations of the circuit, namely once between the multiplicative time signals and the other time between the integration intervals of both input channels.

Here there is provided, for instance, a single function generator 51 for the time signal $g_1$, whereas the time signal $g_2$ only is produced by time-shifting $T_r$ and $2T_r$ in a time-delay element. Two further time-delay elements 53 and 54 in each case ensure for the additional, one-quarter period time-shift for the (approximate) orthogonal component formation. For the integration interval T there are provided two pulse transmitters 55, 56, which, while interposing a further time-delay element 57, again are synchronized by a common excitation-pulse transmitter 58 for the reference location-time-shift $T_r$ and $2T_r$ respectively. In accordance with the shifted integration intervals there are provided two contact sets 59 and 60 with associated relay 61 and 62, which connect the outputs of a multiplier set F with the integrator set S.

The advantage of the circuitry of FIG. 5, in contrast to that of FIG. 4, resides in the fact that there is not required any time-delay for the current- and voltage signals, the spectrum of which changes depending upon the operating conditions and the fault incident. On the other hand, instead there are here required two time-delay elements for the reference location-time-shift as well as a number of contact sets which must be controlled. A third, not particularly illustrated variant arrangement resides in processing the integration intervals with coinciding time position and with appropriate simultaneously controlled contacts as well as with only one reference location-time-delay element for the multiplicative time signal, wherein however, for the time-shifted integral there is generally required at the output side the formation of an additional linear combination of the type which can be expressed by:

$$B'_1 = K_1 \cdot B_1 + K_2 \cdot B_2$$
$$B'_2 = -K_2 \cdot B_1 + K_1 \cdot B_2$$

with suitably selected coefficients $K_1$, $K_2$. Such linear combination can be realized without difficulty by means of a conventional multiplier- and summation circuit.

Figure 6:
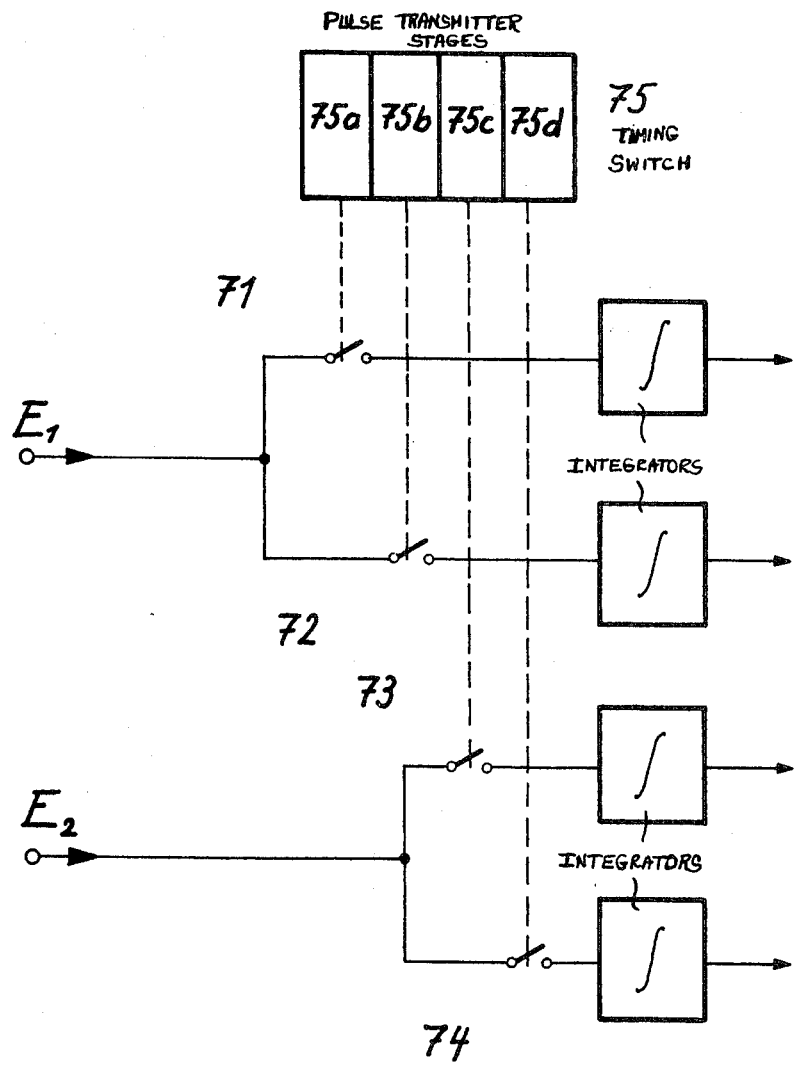
FIG. 6 illustrates a further simplified construction of an integration circuit.

Since, as already mentioned, there basically also can be used simple squarewave-pulses as the multiplier time signals, there is afforded the possibility, according to the circuit arrangement of FIG. 6, to dispense with the use of special multipliers and to replace their function by switches 71-74, which simultaneously determine the integration intervals. The control of the switches then occurs, for instance, by means of a multiple-timing switch 75 wherein the switches 71–74 have operatively associated therewith time-staggered functioning pulse transmitter stages 75a–75d.

Figure 7A:
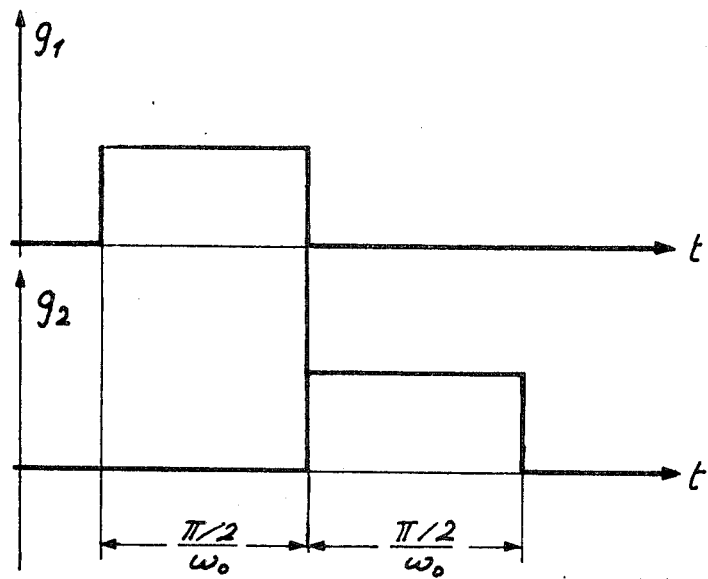
FIGS. 7a and 7b are diagrams of the time course and the frequency spectrum of time functions which can be possibly used for instance for the correlation filtering of measurement current and measurement voltage or auxiliary signals.
Figure 7B:
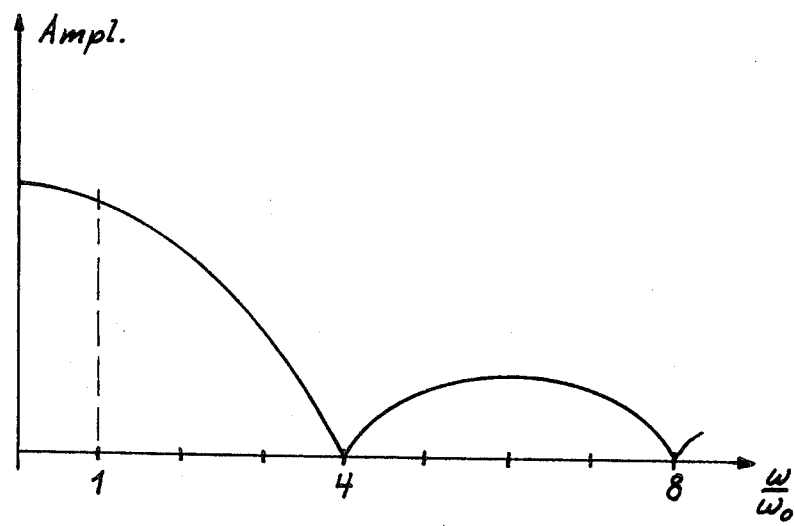

FIG. 7a shows a simple example of time signals $g_1(t)$ and $g_2(t)$ with a squarewave course as a function of time and which are suitable for multiplication with the signals (auxiliary signals or current- or voltage signals, respectively) to be monitored with respect to their phase position, for the purpose of obtaining components. For these time functions, which can be merged by time-shifting the evaluation function $\omega_o$ by one-quarter period, there is valid the same amplitude-frequency spectrum shown in FIG. 7b with periodic successive relative maxima. The first, absolute maximum is at the frequency null, however the amplitude at the evaluation frequency $\omega_o$ is only somewhat less than the absolute maximum and considerably greater than the amplitude at higher multiples of the evaluation frequency. With such or other suitable time functions there can be realized an approximation of the obtained time integrals to the orthogonal components which is satisfactory for many practical applications, and specifically with comparatively short integration intervals of, for instance, one-quarter period of the evaluation function or less. Consequently, there is present the possibility of determining the location of a fault with particular rapidity.

In the illustrated example it is assumed that in the auxiliary- or current- or voltage-channel there is not present any disturbing direct-current component ($\omega=0$). On the other hand, the latter also can be suppressed by multiplication with time functions of suitable amplitude-frequency spectrum (low or disappearing amplitude at $\omega=0$) or also by suitable pre-filtering.

Further, it is to be mentioned that the reference location at the line, determined by a null position of the momentary evaluation function, also can be influenced by means of the weighting factor R. To this end there is advantageously adjusted a reference angle $\phi_r$ by time-shifting or by additive superimposing of an analog signal: approximately in the manner to what was discussed in conjunction with FIG. 1. The correlation of such signal to an effective reference location then is influenced by an adjustment or change of the weighting factor R, so that in particular for a predetermined reference location there is realized a resultant null position of the evaluation function.

The disclosed phase- and fault location detection is not limited in its field of use to the assumption of negligibly small line capacitances. To the extent that one is concerned with the evaluation of null positions of a trigonometric function as evaluation function or a phase angle, i.e. with the detection of the fault location-direction with respect to a reference location, the accuracy of the evaluation is independent of the line capacitances. With the determination of the fault distance from a reference location the relationships are present in converse manner in the sense that this distance — in contrast to Equation (1) is exactly defined by the phase angle and in linear approximation by the tangent. Since this approximation is practically always acceptable — irrespective whether in the one or the other direction — the indicated fault distance-determination has no limitations as concerns the degree to which they are taken into account the different line parameters.

Finally, the different signal processing and evaluation functions can be obtained through the use of known analog circuits or also digital circuits.

While there are shown and described present preferred embodiments of the invention, it is to be distinctly understood that the invention is not limited thereto, but may be otherwise variously embodied and practiced within the scope of the following claims.

Accordingly, what I claim is:

1. In a method of determining the location of a fault on a line, comprising the steps of:

deriving measurement signals from line current and line voltage at a measurement location;

forming current- and voltage signals which are weighted relative to one another from such measurement signals;

superimposing the weighted current- and voltage signals;

employing the superimposed signals for phase detection;

wherein the improvement comprises the steps of:

forming said weighted current- and voltage signals by multplying at least one of the current- or voltage signals with a weighting factor, at least approximately without adding any phase shift to the multiplied signal; and performing said phase detection by deriving from the current- and voltage signals which are weighted relative to one another the phase angle of a sinusoidal-type component of at least one auxiliary signal, corresponding to the sum or difference of a respective pair of measurement currents and measurement voltages weighted relative to one another, the phase angle being formed relative to a reference phase angle which can be correlated to a reference position on the line, and said phase angle of said sinusoidal-type component of said at least one auxiliary signal itself being a function of the distance between the fault location and said reference position.

2. The method as defined in claim 1, including the steps of:

employing as the current- and voltage signals for the determination of the auxiliary signal-phase angle measurement currents and measurement voltages derived from the line current and line voltage, respectively; and after said weighting of said at least one signal additively or subtractively superimposing in pairs said current- and voltage signals into a respective auxiliary signal.

3. The method as defined in claim 2, including the step of:

forming said respective auxiliary signals by the additive and subtractive superimposing of a respective pair of weighted measurement currents and measurement voltages; and determining the phase difference between both auxiliary signals.

4. The method as defined in claim 2, including the step of:

forming an auxiliary signal by the additive or subtractive superimposing of a pair of weighted measurement currents and measurement voltages; and forming the phase difference between the auxiliary signal and the measurement current or a signal correlated thereto.

5. The method as defined in claim 2, including the step of:
forming two respective time integrals of at least one auxiliary signal;
incorporating a mutual time-shift at the intergration intervals within the integrand signals of the time integrals; and
linking the thus obtained time integrals with one another by means of an evaluation function.

6. The method as defined in claim 5, wherein:
said time shift corresponds to one-quarter period of the sinosoidal-type signal component to be evaluated.

7. The method as defined in claim 5, futher including the step of:
multiplying the auxiliary signal within the integrand signals by a time signal, the frequency of which possesses at the region of the evaluation frequency a larger amplitude than at a greater multiple of such frequency.

8. The method as defined in claim 5, further including the step of:
forming two time integrals for each of the signals to be compared with regard to their phase in order to determine the phase angle of an auxiliary signal in relation to a reference signal or in relation to a second auxiliary signal.

9. The method as defined in claim 8, further including the step of:
linking the time integrals by an evaluation function having a numerator term of the type $A_1 \cdot P_2 - A_2 \cdot P_1$.

10. The method as defined in claim 9, further including the step of:
utilizing as the reference signal the measurement current; and
forming apart from the auxiliary signal-time integrals a set of two current-time integrals.

11. The method as defined in claim 5, further including the step of:
introducing a predetermined time-shift relative to the corresponding magnitude of the other signal in the integration intervals or in the integrand signals of the time integral of the signal (auxiliary signal and reference signal or second auxiliary signal) delimiting one of the phase angles which is sought.

12. The method as defined in claim 2, including the step of:
forming two respective time integrals of at least one auxiliary signal multiplied by a time signal;
incorporating a mutual time-shift at the integration intervals within the integrand signals of the time integrals; and
linking the thus obtained time integrals with one another by means of an evaluation function.

13. The method as defined in claim 12, wherein:
said time shift corresponds to one-quarter period of the sinosoidal-type signal component to be evaluated.

14. The method as defined in claim 12, further including the step of:
multiplying the auxiliary signal within the integrand signals by a time signal, the frequency of which possesses at the region of the evaluation frequency a larger amplitude than at a greater multiple of such frequency.

15. The method as defined in claim 12, further including the step of:
forming two time integrals for each of the signals to be compared with regard to their phase in order to determine the phase angle of an auxiliary signal in relation to a reference signal or in relation to a second auxiliary signal.

16. The method as defined in claim 15, further including the step of:
linking the time integrals by an evaluation function having a numerator term of the type $A_1 \cdot P_2 - A_2 \cdot P_1$.

17. The method as defined in claim 16, further including the step of:
utilizing as the reference signal the measurement current; and
forming apart from the auxiliary signal-time integrals a set of two current-time integrals.

18. The method as defined in claim 12, further including the step of:
introducing a predetermined time-shift relative to the corresponding magnitude of the other signal in the integration intervals or in the integrand signals of the time integral of the signal (auxiliary signal and reference signal or second auxiliary signal) delimiting one of the phase angles which is sought.

19. The method as defined in claim 1, further including the step of:
forming as the current- and voltage signals for determination of the phase angle of an auxiliary signal first and second time integrals of the measurement currents and measurement voltages;
introducing a time-shift in the integration intervals within the integrand signals of the first or second time integrals relative to a corresponding magnitude of the first or second time integrals; and
linking the time integrals with one another by an evaluation function.

20. The method as defined in claim 19, wherein:
said time-shift corresponding to one-quarter period of the sinusoidal-type signal component to be evaluated.

21. The method as defined in claim 19, further including the step of:
multiplying the measurement current and the measurement voltage by a time signal within the relevant integrand signal, the frequency spectrum of such time signal at the region of the evaluation frequency possessing a greater amplitude than at a higher multiple of such frequency.

22. The method as defined in claim 19, wherein:
the time integrals are linked with one another by an evaluation function having a quotient of the type:

$$\frac{U_1 \cdot I_2 - U_2 \cdot I_1}{R^2 \cdot I_1^2 - U_1^2 + R^2 \cdot I_2^2 - U_2^2}$$

while using a weighting factor R.

23. The method as defined in claim 19, further including the step of:
forming two sets of time integrals which each encompass at least a part of the measurement currents and measurement voltages in their integrand signals; and
introducing at the integration intervals and in the integrand signals of the time integrals of one set a predetermined time-shift relative to the corresponding magnitude of the other set.

24. The method as defined in claim 23, wherein:

the time integrals of both sets are linked with one another by an evaluation function having a numerator of the type:

$$R(I_1 \cdot I_2' - I_1' \cdot I_2) - (I_1 \cdot U_2' + I_1' \cdot U_2 - I_2' \cdot U_1 - I_2 \cdot U_1') + (1/R)(U_1' \cdot U_2 - U_1 \cdot U_2')$$

while using a weighting factor R.

25. The method as defined in claim 23, wherein:
the time integrals of both sets, of which one encompasses only measurement current-time integrals or only measurement voltage-time integrals, are linked with one another by an evaluation function having a numerator term of the type:

$$R(I_1' \cdot I_2 - I_1 \cdot I_2) + U_1' \cdot I_2 - U_2' \cdot I_1$$

or $$R(I_1 \cdot I_2' - I_1' \cdot I_2) + U_1 \cdot I_2' - U_2 \cdot I_1'$$

while using a weighting factor R.

26. The method as defined in claim 1, further including the step of:
weighting the measurement currents and measurement voltages relative to one another in an adjustable relationship.

27. The method as defined in claim 1, further including the step of:
forming as the current- and voltage signals for determination of the phase angle of an auxiliary signal first and second time integrals of the measurement currents and measurement voltages which are multiplied by a respective time signal;
introducing a time-shift in the integration intervals or the measurement currents or measurement voltages multiplied by such time signals within the integrand signals of the first or second time integrals relative to a corresponding magnitude of the first or second time integrals; and
linking the time integrals with one another by an evaluation function.

28. The method as defined in claim 27, wherein:
said time-shift corresponds to one-quarter period of the sinusoidal-type signal component to be evaluated.

29. The method as defined in claim 27, further including the step of:
multiplying the measurement current and the measurement voltage by a time signal within the relevant integrand signal, the frequency spectrum of such time signal at the region of the evaluation frequency possessing a greater amplitude than at a higher multiple of such frequency.

30. The method as defined in claim 27, wherein:
the time integrals are linked with one another by an evaluation function having a quotient of the type:

$$\frac{U_1 \cdot I_2 - U_2 \cdot I_1}{R^2 \cdot I_1^2 - U_1^2 + R^2 \cdot I_2^2 - U_2^2}$$

while using a weighting factor R.

31. The method as defined in claim 27, further including the step of:
forming two sets of time integrals which each encompass at least a part of the measurement currents and measurement voltages in their integrand signals; and
introducing at the integration intervals and in the integrand signals of the time integrals of one set a predetermined time-shift relative to the corresponding magnitude of the other set.

32. The method as defined in claim 31, wherein: the time integrals of both sets are linked with one another by an evaluation function having a numerator of the type:

$$R(I_1 \cdot I_2' - I_1' \cdot I_2) - (I_1 \cdot U_2' + I_1' \cdot U_2 - I_2' \cdot U_1 - I_2 \cdot U_1') + (1/R)(U_1' \cdot U_2 - U_1 \cdot U_2')$$

while using a weighting factor R.

33. The method as defined in claim 31, wherein:
the time integrals of both sets, of which one encompasses only measurement current-time integrals or only measurement voltage-time integrals, are linked with one another by an evaluation function having a numerator term of the type:

$$R(I_1' \cdot I_2 - I_1 \cdot I_2') + U_1' \cdot I_2 - U_2' \cdot I_1$$

or $$R(I_1 \cdot I_2' - I_1' \cdot I_2) + U_1 \cdot I_2' - U_2 \cdot I_1'$$

while using a weighting factor R.

34. The method as defined in claim 1, further including the step of:
weighting the measurement currents and measurement voltages relative to one another in an adjustable relationship.

35. An apparatus for determing a fault location on a line comprising, in combination:
a measuring station including a measurement location;
measuring means provided for the measuring station for measuring the line currents and line voltages appearing at the measuring location;
said measuring means including converter means for transforming the line currents and line voltages into signals corresponding to measurement currents and measurement voltages respectively;
said converter means including multiplier- or divider circuitry for weighting the current signals and voltage signals relative to one another;
an evaluation circuit connected to said converter means for the determination of the fault direction and fault distance;
said evaluation circuit including at least one phase detector delivering a phase angle signal which characterizes by its sign and magnitude the fault direction and the fault distance, respectively, in relation to a reference position on the line; and
said multiplier or divider circuitry being structured so as to add at least approximately no phase shift to said current signals and voltage signals to be weighted.

36. The apparatus as defined in claim 35, wherein:
said multiplier- or divider circuit is selectively supplied with at least one of said measurement current signal and said measurement voltage signal;
at least one additive or subtractive superimposing circuitry for the formation of at least one auxiliary signal composed of mutually relatively weighted measurement current signals and measurement voltage signals; and said at least one phase detector having supplied thereto one such auxiliary signal and a reference signal.

37. The apparatus as defined in claim 35, wherein:
said phase detector comprises at least an integration circuit for the formation of amplitude components of at least one auxiliary signal; and
at least one evaluation circuit for forming at least one numerator term of a trigonemetric function of an auxiliary signal-phase angle expressed by amplitude components.

38. The apparatus as defined in claim 37, wherein:
said phase detector forms approximately orthogonal components.

39. The apparatus as defined in claim 35, further including:
at least two integrators for the formation of time integrals of measurement current signals and measurement voltage signals; and
said multiplier or divider circuitry encompassing at least one multiplier- or divider circuit for the weighting of the measurement current integrals or measurement voltage integrals.

40. The apparatus as defined in claim 39, wherein said integrators comprise:
at least one pair of measurement current integrators;
at least one pair of measurement voltage integrators; and
means for introducing between the integrators of each pair an integration interval time-shift or integrand signal time-shift corresponding at least approximately to one-quarter period of the evaluation frequency.

41. The apparatus as defined in claim 40, further including:
at least two pairs of measurement current integrators having a mutual integrand interval time-shift or integrand signal time-shift between such pairs corresponding to a reference-phase angle.

42. The apparatus as defined in claim 40, further including:
at least two pairs of measurement voltage integrators having a mutual integrand interval time-shift or integrand signal time-shift between such pairs corresponding to a reference-phase angle.

* * * * *